(12) United States Patent
Schrogmeier et al.

(10) Patent No.: US 7,751,231 B2
(45) Date of Patent: Jul. 6, 2010

(54) METHOD AND INTEGRATED CIRCUIT FOR DETERMINING THE STATE OF A RESISTIVITY CHANGING MEMORY CELL

(75) Inventors: Peter Schrogmeier, Munich (DE); Ulrich Klostermann, Munich (DE)

(73) Assignee: Qimonda AG, Munich (DE)

( * ) Notice: Subject to any disclaimer, the term of this patent is extended or adjusted under 35 U.S.C. 154(b) by 277 days.

(21) Appl. No.: 12/115,433

(22) Filed: May 5, 2008

(65) Prior Publication Data
US 2009/0273967 A1    Nov. 5, 2009

(51) Int. Cl.
G11C 11/00 (2006.01)
(52) U.S. Cl. .................................. 365/158; 365/171
(58) Field of Classification Search ................ 365/158, 365/171, 173
See application file for complete search history.

(56) References Cited

U.S. PATENT DOCUMENTS

| 6,081,446 | A | 6/2000 | Brug et al. |
| 6,483,740 | B1 | 11/2002 | Spitzer et al. |
| 6,538,917 | B1 | 3/2003 | Tran et al. |
| 6,577,529 | B1 * | 6/2003 | Sharma et al. ............... 365/158 |
| 6,587,370 | B2 | 7/2003 | Hirai |
| 6,826,023 | B2 * | 11/2004 | Hayakawa ............... 360/324.2 |
| 7,018,725 | B2 | 3/2006 | Odagawa et al. |
| 7,130,235 | B2 | 10/2006 | Perner |
| 2005/0152181 | A1 * | 7/2005 | Katti ......................... 365/158 |

FOREIGN PATENT DOCUMENTS

| DE | 19947118 C1 | 3/2001 |
| DE | 10307991 A1 | 3/2004 |
| DE | 102004011418 A1 | 2/2005 |
| DE | 102004039236 A1 | 8/2005 |
| EP | 1256958 A2 | 11/2002 |

* cited by examiner

Primary Examiner—Anh Phung
(74) Attorney, Agent, or Firm—Dicke, Billig & Czaja, PLLC (57) ABSTRACT

A method and an integrated circuit for determining the state of a resistivity changing memory cell. In one embodiment the method includes detecting a first resistance of the resistivity changing memory cell, determining whether the first resistance value is smaller than a predetermined threshold value thereby determining a first result value, initializing the resistivity changing memory cell into one of at least four resistivity changing memory states, detecting a second resistance value of the resistivity changing memory cell, determining whether the second resistance value is smaller than the predetermined threshold value determining a second result value, and determining the state of the resistivity changing memory cell state using the first and the second result values.

15 Claims, 10 Drawing Sheets

First Resistance Value

METHOD AND INTEGRATED CIRCUIT FOR DETERMINING THE STATE OF A RESISTIVITY CHANGING MEMORY CELL

BACKGROUND

This invention relates to semiconductor structures, and more particularly, to resistivity changing memories.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "upper", "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following Detailed Description, the described embodiments of the present invention are valid for integrated circuits, including not only for the MTJ device, but also for the method of programming the MTJ device, for the method of forming the MTJ device and for the MRAM array including the MTJ device.

Magnetic (or magneto-resistive) random access memory (MRAM) is a non-volatile memory technology that shows considerable promise for long-term data storage. A conventional magnetic memory element (also referred to as a tunneling magneto-resistive or TMR-device) includes a structure having ferromagnetic layers separated by a non-magnetic layer (barrier) and arranged into a magnetic tunnel junction (MTJ).

Digital information is stored and represented in the magnetic memory element as directions of magnetization vectors in the ferromagnetic layers. Conventionally, the magnetic moment of one ferromagnetic layer is magnetically fixed or pinned and kept rigid (also referred to as "fixed layer" or "hard layer"), while the magnetic moment of the other ferromagnetic layer (also referred to as "free layer" or "soft layer") is free to be switched between the parallel (low resistance) and anti-parallel (high resistance) magnetization directions with respect to the fixed magnetization direction of the hard layer by application of electric currents, therein inducing a change in the cell resistance.

These currents are typically applied through conductive write lines referred to as bit lines and word lines, which are disposed so that the bit lines are orthogonal to the word lines. In an MRAM array, an MTJ memory cell is located at each intersection of a bit line with a word line.

In a typical MTJ cell, to switch the direction of magnetization of the free layer of a particular cell, currents are applied through the bit line and the word line that intersect at that cell. The direction of these currents determines the direction in which the magnetization of the free layer will be set. The combined magnitude of the currents through the word and bit lines must be sufficient to generate a magnetic field at their intersection that is strong enough to switch the direction of magnetization of the free layer.

The corresponding logic state ("0" or "1") of the memory is hence defined by its resistance state (low or high), monitored by a small read current.

Figure 1:
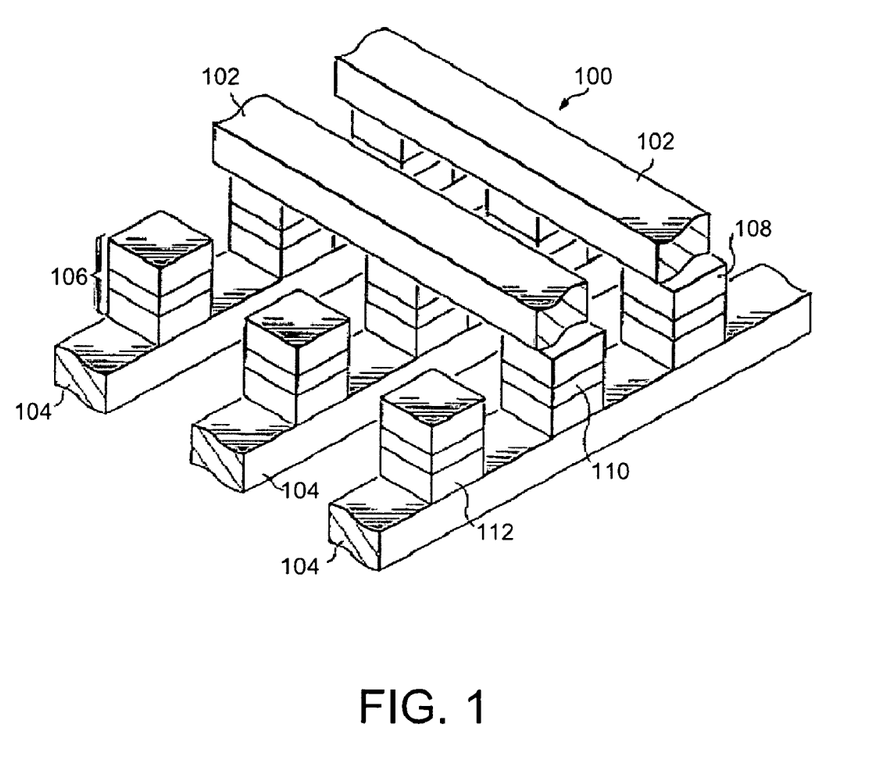
FIG. 1 illustrates a perspective view of an integrated circuit including an MRAM array.

FIG. 1 shows a perspective view of an MRAM array 100 having bit lines 102 disposed in an orthogonal direction to word lines 104 in adjacent metallization layers. Magnetic memory stacks 106 are electrically coupled to the bit lines 102 and word lines 104 (collectively, write lines), and are positioned between the bit lines 102 and word lines 104 at locations where a bit line 102 crosses a word line 104. The magnetic memory stacks 106 may be magnetic tunnel junctions (MTJs), comprising multiple layers, including a first ferromagnetic layer structure 108 (e.g a hard layer), a non ferromagnetic layer structure 110, and a second ferromagnetic layer structure 112 (e.g. a soft layer). The first ferromagnetic layer structure 108 and the second ferromagnetic layer structure 112 may comprise a plurality of magnetic metal layers (not shown). These magnetic metal layers may, for example, comprise eight to twelve layers of materials such as PtMn, CoFe, Ru, and NiFe. The non ferromagnetic layer structure 110 may comprise a dielectric, such as $Al_2O_3$.

The first ferromagnetic layer structure 108 may be magnetized in a fixed direction, functioning as a reference memory element having a known magnetization state, while the direction of magnetization of the second ferromagnetic layer structure 112 may be switched, changing the resistance of the magnetic memory stack 106. One bit of digital information may be stored in a magnetic memory stack 106 by running a current in the appropriate direction through the bit line 102 and the word line 104 that intersect at the magnetic memory stack 106, creating a sufficient magnetic field to set the direction of magnetization of the second ferromagnetic layer structure 112. Information may be read from a magnetic memory stack 106 by applying a voltage across the magnetic memory stack, and measuring the resistance. If the direction of magnetization of the second ferromagnetic layer structure 112 is parallel to the direction of magnetization of the first ferromagnetic layer structure 108, then the measured resistance will be low, representing for example a value of "0" for the bit. If the direction of magnetization of the second ferromagnetic layer structure 112 is anti-parallel to the direction of the first ferromagnetic layer structure 108, then the resistance will be high, representing for example a value of "1".

Figure 2A:
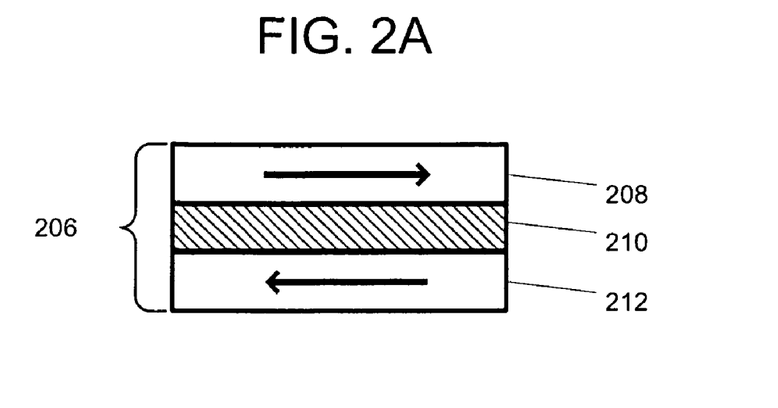
FIGS. 2A and 2B each illustrate an alternative example of the magnetization state of a magnetic memory stack.
Figure 2B:
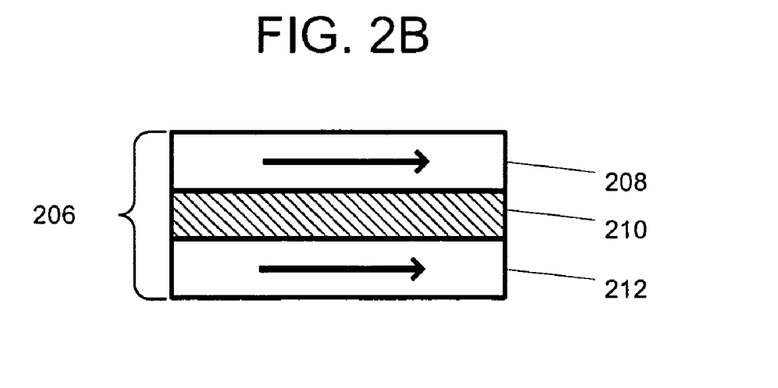

FIGS. 2A and 2B each illustrate an alternative example of the magnetization state of a magnetic memory stack 206. In this case the magnetic memory stack 206 includes a non ferromagnetic layer structure 210 sandwiched between a first ferromagnetic layer structure 208 ("hard layer") and a second ferromagnetic layer structure 212 ("soft layer"), the second ferromagnetic layer structure 212 ("soft layer") having a coercive force that is smaller than that of the first ferromagnetic layer structure 208 ("hard layer"). The resistance value of the resistivity changing element 206 varies depending on whether the first ferromagnetic layer structure 208 ("hard layer") and the second ferromagnetic layer structure 212 ("soft layer") are magnetized in parallel directions with respect to each other as shown in FIG. 2A (in this case the measured resistance will be low) or in antiparallel directions with respect to each other as shown in FIG. 2B (in this case the measured resistance will be high).

During the write operation a relatively strong external magnetic field is applied to the resistivity changing element 206 determining the magnetization direction of the first ferromagnetic layer structure 208 ("hard layer") according to the information ("1" or "0") to be stored.

During the read operation the second ferromagnetic layer structure 212 ("soft layer") is first magnetized in a predetermined direction applying an external magnetic field, this magnetic field being smaller than the magnetic field generated during the write operation. In this way the soft layer 212 is initialized and the magnetization direction of the hard layer 208 is not altered. Next, the resistance value of the resistivity changing element 206 is measured and stored as a first resistance value. Following this, the magnetization direction of the soft layer 212 is reversed applying an external magnetic field, this magnetic field being smaller than the magnetic field generated during the write operation, hence without altering the magnetization direction of the hard layer 208. The resistance value of the resistivity changing element 206 is measured again; this second resistance value is then compared with the first resistance value previously measured. The value of the stored information bit in the hard layer 208 can be derived by comparison of the two resistance values. In this way no reference cells are necessary to reproduce the stored information.

According to one embodiment, a multilevel resistivity changing memory cell 306 can be generated by storing one bit of information in the first ferromagnetic layer structure 308 and one bit of information in the second ferromagnetic layer structure 312. An independent writing of the two ferromagnetic layers is made possible using magnetic switching thresholds.

FIGS. 3A, 3B, 3C, and 3D illustrates four different combinations of magnetization of the resistivity changing memory cell 306 according to one embodiment of the invention. The magnetic memory stack 306 includes a non ferromagnetic layer structure 310 sandwiched between a first ferromagnetic layer structure 308 ("hard layer") and a second ferromagnetic layer structure 312 ("soft layer"), the second ferromagnetic layer structure 312 ("soft layer") having a coercive force that is smaller than that of the first ferromagnetic layer structure 308 ("hard layer"). The resistance value of the resistivity changing element 306 varies depending on whether the first ferromagnetic layer structure 308 ("hard layer") and the second ferromagnetic layer structure 312 ("soft layer") are magnetized in parallel directions with respect to each other (in this case the measured resistance will be low) or in antiparallel directions with respect to each other (in this case the measured resistance will be high).

To each of the four different combinations of magnetization of the resistivity changing memory cell 306 shown in FIGS. 3A, 3B, 3C and 3D a different two bits stored information can be associated. Stored information of 11 may be for example associated to the parallel magnetization of the ferromagnetic layers 308 and 312 shown in FIG. 3A. Stored information of 10 may be for example associated to the antiparallel magnetization of the ferromagnetic layers 308 and 312 shown in FIG. 3B. Stored information of 01 may be for example associated to the antiparallel magnetization of the ferromagnetic layers 308 and 312 shown in FIG. 3C. Stored information of 00 may be for example associated to the parallel magnetization of the ferromagnetic layers 308 and 312 shown in FIG. 3D.

During the write operation the first bit of information is stored for example in the first ferromagnetic layer structure 308 by applying a first magnetic field to the resistivity changing memory cell 306. The second bit of information is stored for example in the second ferromagnetic layer structure 312 by applying a second magnetic field to the resistivity changing memory cell 306, this second magnetic field being smaller than the magnetic switching threshold of the first ferromagnetic layer structure 308, hence without altering its magnetization.

During the read operation the first resistance value of the resistivity changing element 306 is measured and may be stored in a storing device (e.g. a latch). If the ferromagnetic layer structures 308 and 312 are magnetized in parallel directions with respect to each other the measured resistance will be low and two possible values may be stored in the resistivity changing element 306: 11 (according to the example of FIG. 3A) or 00 (according to the example of FIG. 3D). If the ferromagnetic layer structures 308 and 312 are magnetized in antiparallel directions with respect to each other the measured resistance will be high and two possible values may be stored in the resistivity changing element 306: 10 (according to the example of FIG. 3B) or 01 (according to the example of FIG. 3C).

Next, the second ferromagnetic layer structure 312 is magnetized in a predetermined direction (initialized) applying an external magnetic field, this magnetic field being smaller than the magnetic switching threshold of the first ferromagnetic layer structure 308, hence without altering its magnetization direction. Due to the initialization of the ferromagnetic layer structure 312 the magnetization combinations of the ferromagnetic layer structures 308 and 312 may be modified as shown in FIGS. 4A, 4B, 4C and 4D. In the two cases the magnetization direction of the ferromagnetic layer structure 312 has been reversed. FIG. 4B shows the resistivity changing element 306 after the reversal of the second ferromagnetic layer structure 412: the ferromagnetic layer structures are now magnetized in parallel directions with respect to each other (low resistance) while originally (FIG. 3B) they were magnetized in antiparallel directions with respect to each other (high resistance) storing the information 10. FIG. 4D shows the resistivity changing element 306 after the reversal of the second ferromagnetic layer structure 412: the ferromagnetic layer structures are magnetized in antiparallel directions with respect to each other (high resistance) while originally (FIG. 3D) they were magnetized in parallel directions with respect to each other (low resistance) storing the information 00.

Following this, the resistance value of the resistivity changing element 306 is measured again; this second resistance value may be stored in a storing device (e.g. a latch).

The second resistance value is then compared with the first resistance value. If the first resistance value is substantially equal to the second resistance value, it means that the initialization has not reversed the second ferromagnetic layer structure 312. In the example shown in FIGS. 3A-3D and FIGS. 4A-4D this case corresponds to the FIGS. 3A-4A (parallel magnetization, low resistance, stored value 11) and FIGS. 3C-4C (antiparallel magnetization, high resistance, stored value 01). As a consequence, according to this example, if the measured resistance is low the information 11 will be reproduced, while if the measured resistance is high the information 01 will be reproduced.

On the contrary, if the first resistance value is substantially different from the second resistance value, it means that the initialization has reversed the second ferromagnetic layer structure 312. In the example shown in FIGS. 3A-3D and FIGS. 4A-4D this case corresponds to the FIG. 3B-4B: from antiparallel (high resistance, original stored value 10) to parallel magnetization (low resistance), and FIGS. 3D-4D: from parallel (low resistance, original stored value 00) to antiparallel magnetization (high resistance). As a consequence, according to this example, if the second resistance value is low the information 10 will be reproduced, while if the measured resistance is high the information 00 will be reproduced.

After the comparison and the reproduction of the information, the original information stored in the second ferromagnetic layer structure 312 is restored. Alternatively, the original information stored in the second ferromagnetic layer structure 312 may be restored only if the second resistance value is different from the first resistance value, for example reversing the second ferromagnetic layer structure 312.

Figure 5A:
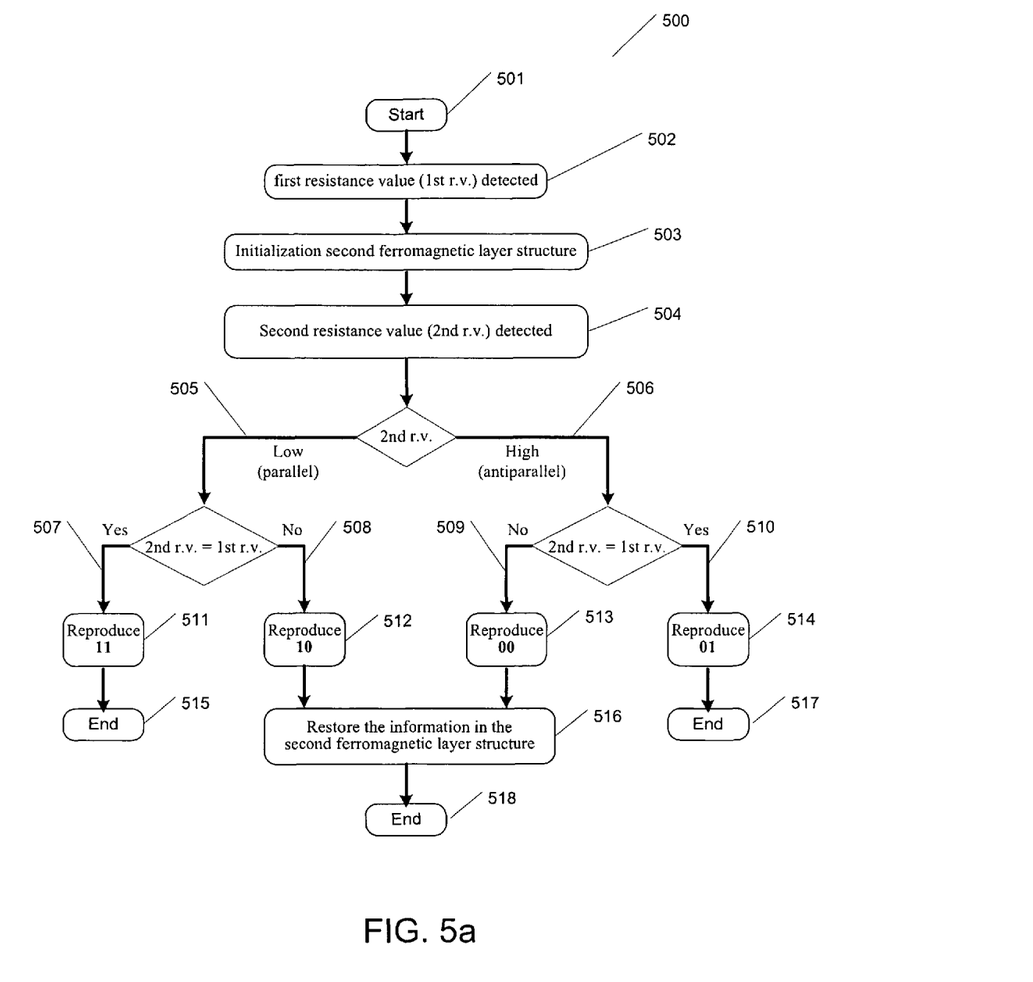
FIGS. 5a and 5b illustrates flowcharts of the reading method for the resistivity changing memory.

FIG. 5a illustrates a flowchart 500 of the reading method for the resistivity changing memory 306 according to one embodiment. In the beginning (block 501) the first resistance value of the resistivity changing memory 306 is measured (block 502). Next, the second ferromagnetic layer structure 312 is magnetized in a predetermined direction (initialized) applying an external magnetic field (block 503), this magnetic field being smaller than the magnetic switching threshold of the first ferromagnetic layer structure 308, hence without altering its magnetization direction. Following this, a second resistance value of the resistivity changing element 306 is measured (block 504). If the detected second resistance value is low (path 505, it means that the first 308 and the second 312 ferromagnetic layer structures are magnetized in parallel directions with respect to each other) and the second resistance value is substantially equal to the first resistance value (path 507), then the two bits of information 11 are reproduced (block 511) and the reading process is completed (block 515). If the detected second resistance value is low (path 505) and the second resistance value is substantially different from the first resistance value (path 508), then the two bits of information 10 are reproduced (block 512), the information in the second ferromagnetic layer structure is restored (block 516) and the reading process is completed (block 518). If the detected second resistance value is high (path 506, it means that the first 308 and the second 312 ferromagnetic layer structures are magnetized in antiparallel directions with respect to each other) and the second resistance value is substantially equal to the first resistance value (path 510), then the two bits of information 01 are reproduced (block 514) and the reading process is completed (block 517). If the detected second resistance value is high (path 506) and the second resistance value is substantially different from the first resistance value (path 509), then the two bits of information 00 are reproduced (block 513), the information in the second ferromagnetic layer structure is restored (block 516) and the reading process is completed (block 518).

Figure 5B:
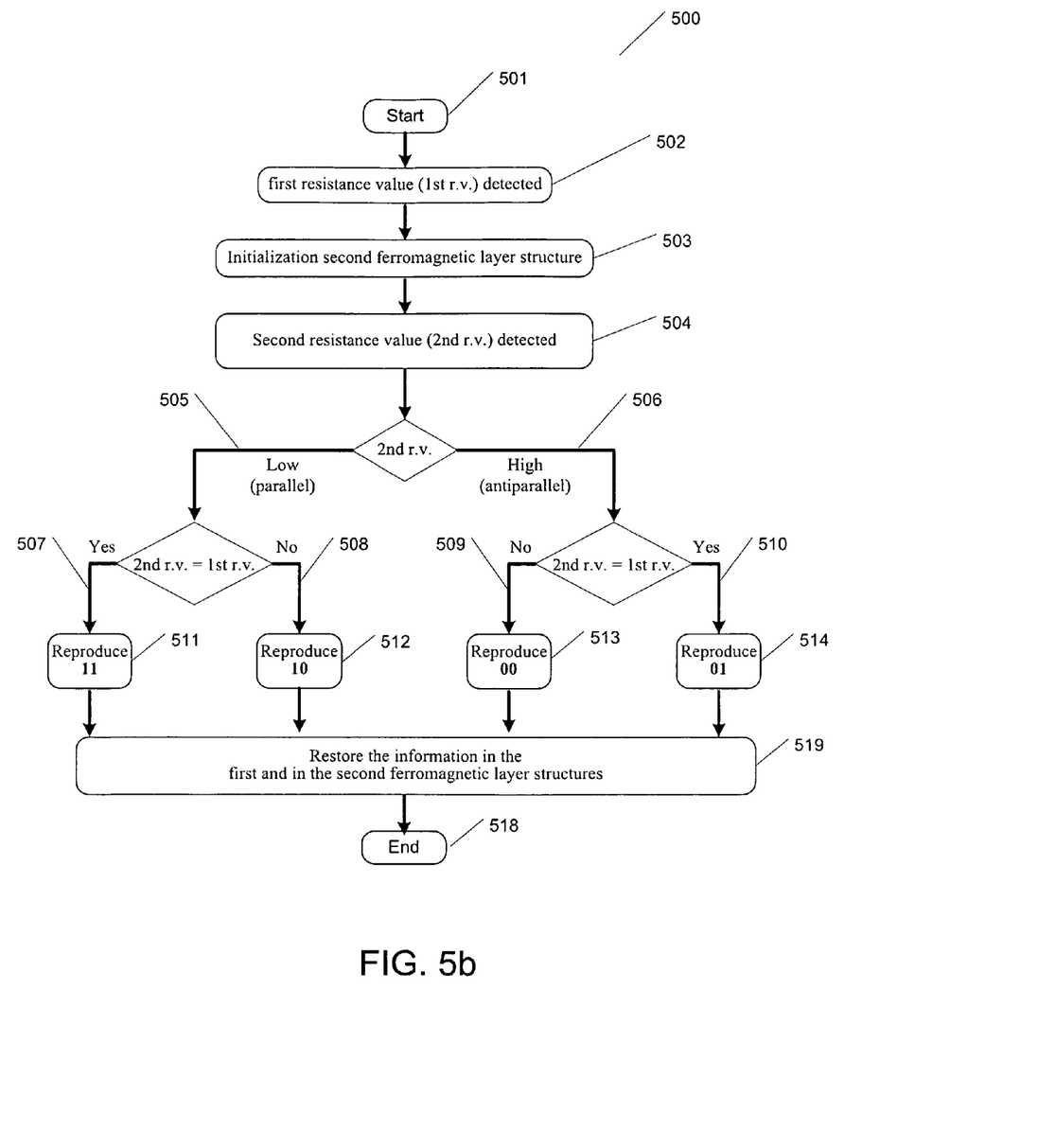

Alternatively, as shown in FIG. 5b the information in the first and the second ferromagnetic layer structure may be restored (block 519).

Figure 6:
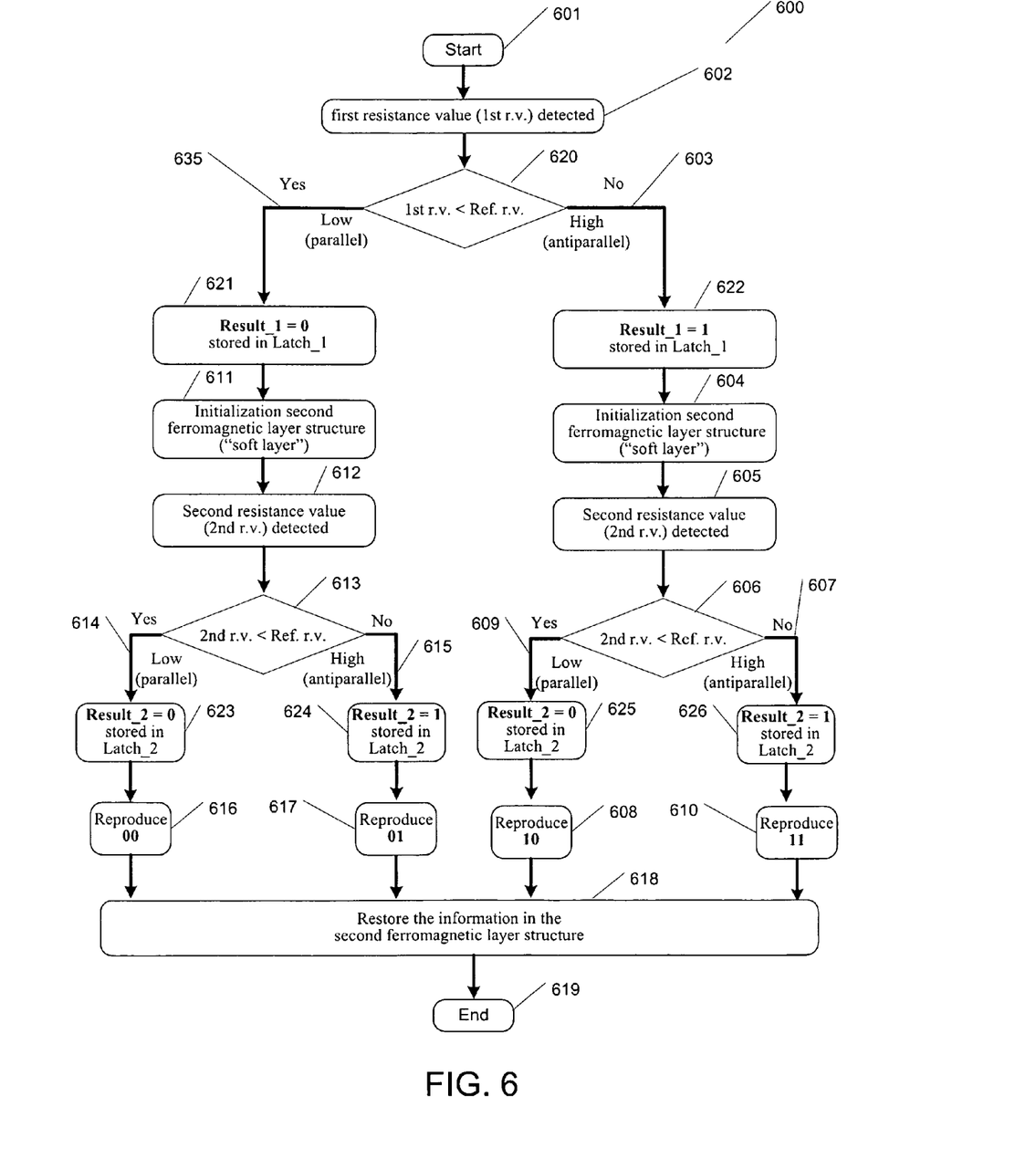
FIG. 6 illustrates a flowchart of the reading method for a resistivity changing memory.

FIG. 6 illustrates a flowchart 600 of the reading method for the resistivity changing memory 306 according to another embodiment.

According to this embodiment, during the write operation, the first bit of information is stored for example in the first ferromagnetic layer structure 308 by applying a first magnetic field to the resistivity changing memory cell 306. The second bit of information is stored for example in the second ferromagnetic layer structure 312 by applying a second magnetic field to the resistivity changing memory cell 306, this second magnetic field being smaller than the magnetic switching threshold of the first ferromagnetic layer structure 308, hence without altering its magnetization.

During the read operation (block 601) the resistance value of the resistivity changing element 306 is measured and a first resistance value ($1^{st}$ r.v.) is detected (block 601). This first resistance value is compared (block 620) with a Reference resistance value (Ref. r.v.). If the ferromagnetic layer structures 308 and 312 are magnetized in parallel directions with respect to each other the first resistance value ($1^{st}$ r.v.) will be low (i.e. smaller than the Reference resistance value, line 635) and a first result (Result_1) can be stored in a first Latch (Latch_1), for example Result_1=0 (block 621). If the ferromagnetic layer structures 308 and 312 are magnetized in antiparallel directions with respect to each other the first resistance value ($1^{st}$ r.v.) will be high (i.e. larger than the Reference resistance value line 603.) and a first result (Result_1) can be stored in a first Latch (Latch_1), for example Result_1=1 (block 622).

Next, the second ferromagnetic layer structure 312 ("soft layer") is magnetized in a predetermined direction (initialized) applying an external magnetic field (blocks 611 and 604), this magnetic field being smaller than the magnetic switching threshold of the first ferromagnetic layer structure 308, hence without altering its magnetization direction. Due to the initialization of the ferromagnetic layer structure 312 the magnetization combinations of the ferromagnetic layer structures 308 and 312 may be modified as shown in FIGS. 4A, 4B, 4C and 4D. In two cases the magnetization direction of the ferromagnetic layer structure 312 has been reversed. FIG. 4B shows the resistivity changing element 306 after the reversal of the second ferromagnetic layer structure 412: the ferromagnetic layer structures are now magnetized in parallel directions with respect to each other (low resistance) while originally (FIG. 3B) they were magnetized in antiparallel directions with respect to each other (high resistance). FIG. 4D shows the resistivity changing element 306 after the reversal of the second ferromagnetic layer structure 412: the ferromagnetic layer structures are magnetized in antiparallel directions with respect to each other (high resistance) while originally (FIG. 3D) they were magnetized in parallel directions with respect to each other (low resistance).

Following this, the resistance value of the resistivity changing element 306 is measured again; and a second resistance value ($2^{nd}$ r.v.) is detected (blocks 612 and 605). This second resistance value is compared (blocks 603 and 606) with the Reference resistance value (Ref r.v.).

If the ferromagnetic layer structures 308 and 312 are magnetized in parallel directions with respect to each other the second resistance value ($2^{nd}$ r.v.) will be low (i.e. smaller than the Reference resistance value, lines 614 and 609) and a second result (Result_2) can be stored in a second Latch (Latch_2), for example Result_2=0 (blocks 623 and 625). The first results (Result_1 in blocks 621 and 622) and the second results (Result_2 in blocks 623 and 625) can be combined in a decoder to provide a given set of results according to the logic chosen in the decoder, for example 00 (block 616) or 10 (block 608).

If the ferromagnetic layer structures 308 and 312 are magnetized in antiparallel directions with respect to each other the second resistance value ($2^{nd}$ r.v.) will be high (i.e. larger than the Reference resistance value, lines 615 and 607) and a second result (Result_2) can be stored in a second Latch (Latch_2), for example Result_2=1 (blocks 624 and 626). The first results (Result_1 in blocks 621 and 622) and the second results (Result_2 in blocks 624 and 626) can be combined in a decoder to provide a given set of results according to the logic chosen in the decoder, for example 01 (block 617) or 11 (block 610).

After the comparison and the reproduction of the information, the original information stored in the second ferromagnetic layer structure 312 is restored (block 618) and the read operation is terminated (block 618). Alternatively, the original information stored in the second ferromagnetic layer structure 312 may be restored only if the second resistance value is different from the first resistance value, for example reversing the second ferromagnetic layer structure 312.

Figure 3A:
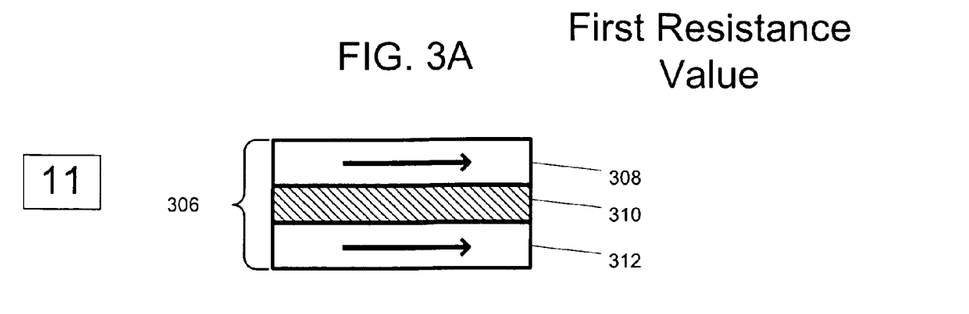
FIGS. 3A, 3B, 3C, and 3D illustrate four different combinations of magnetization of the resistivity changing memory cell.
Figure 3B:
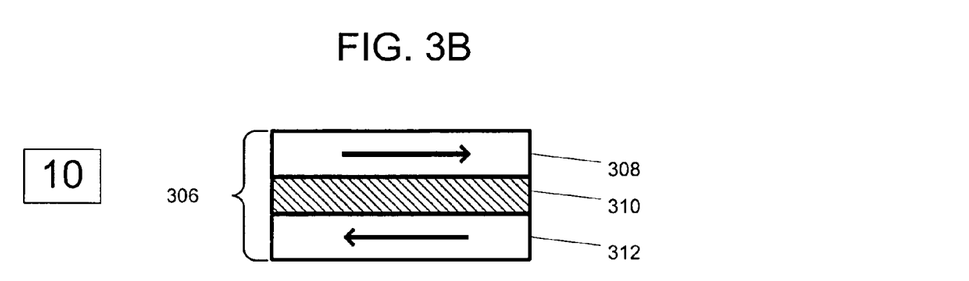
Figure 3C:
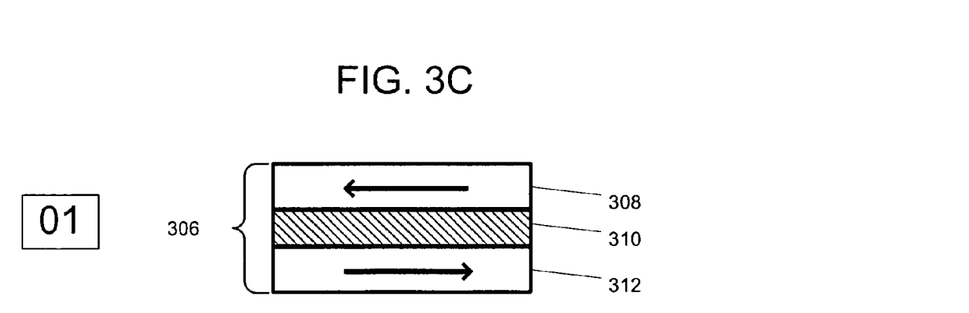
Figure 3D:
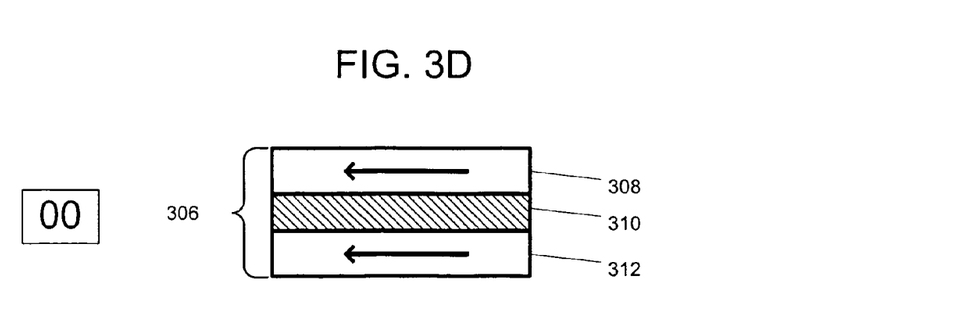
Figure 4A:
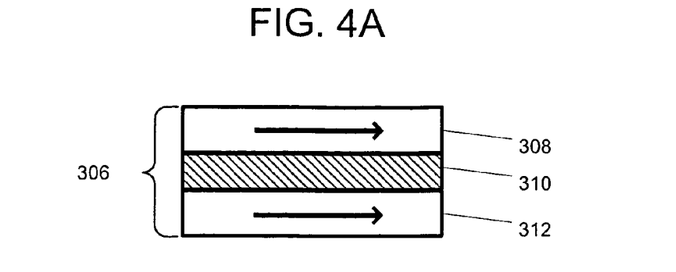
FIGS. 4A, 4B, 4C and 4D illustrate magnetization states of a resistivity changing element.
Figure 4B:
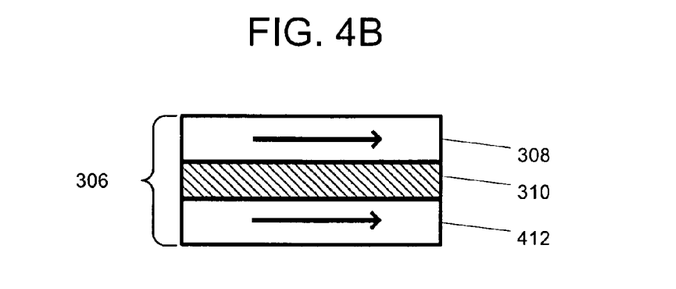
Figure 4C:
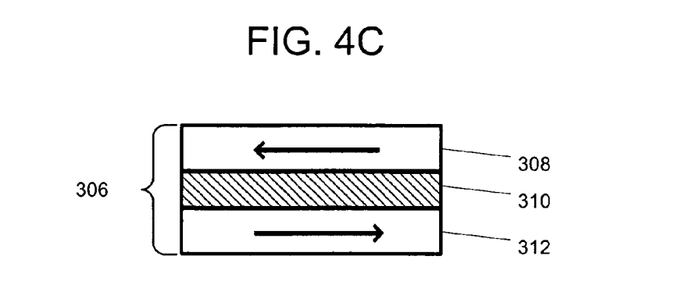
Figure 4D:
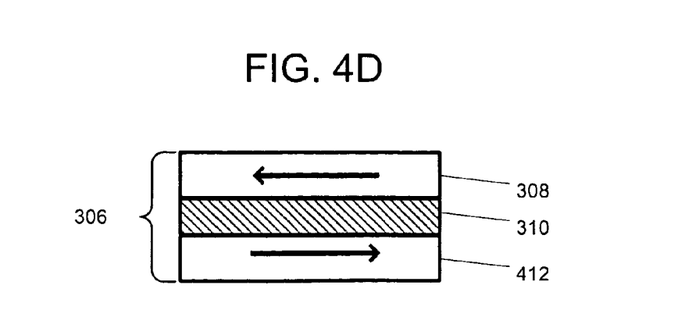

The association of the particular combinations of the two bits of information with the combination of the magnetization directions of the two ferromagnetic layers 308 and 312 shown in FIGS. 3A÷3D, FIGS. 4A÷4D and FIG. 5 or the association of the particular combinations of the two bits of information with the combination of Result_1 and Result_2 shown in FIG. 6 should be considered only as an example: other combinations are possible and may be applied to other embodiments of the invention.

Figure 7:
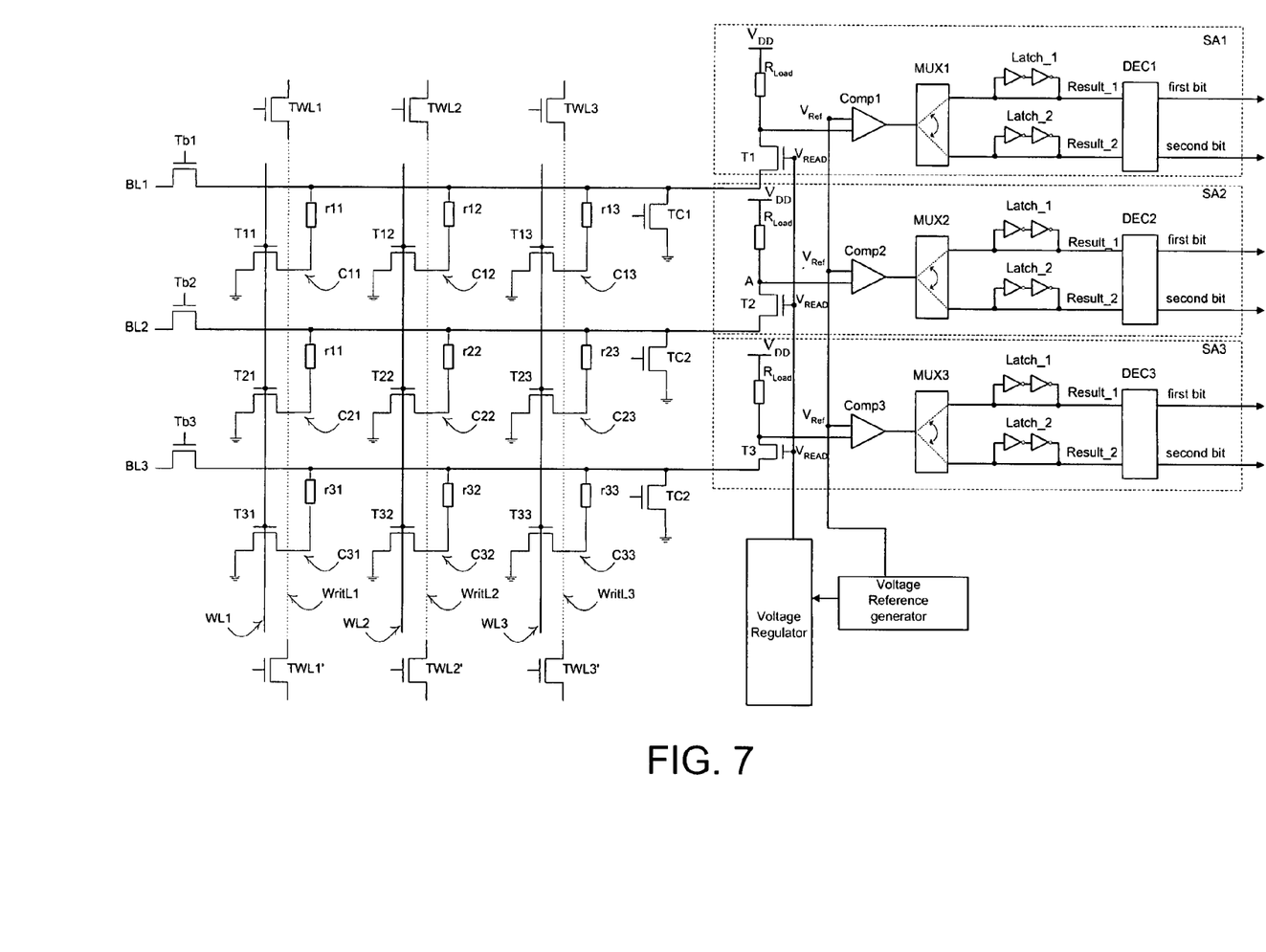
FIG. 7 is an equivalent circuit diagram showing one example of implementation of one of the embodiment.

FIG. 7 is an equivalent circuit diagram showing an example of implementation of one of the embodiments.

The magnetic memory according to this embodiment mode includes memory cells C11 to C33 that are arranged to form a three by three matrix; word lines WL1, WL2, and WL3; bit lines BL1, BL2, and BL3; write lines WritL1, WritL2, and WritL3; field effect type transistors TWL1, TWL2, TWL3, TWL1', TWL2', TWL3', Tb1, Tb2, Tb3, TC1, TC2 and TC3; and sense amplifiers SA1, SA2, and SA3.

The bit lines BL1, BL2, and BL3 are arranged parallel to each other and the word lines WL1, WL2, and WL3 are also arranged parallel to each other, with the bit lines BL1, BL2, and BL3 crossing the word lines WL1, WL2, and WL3. Like the word lines WL1, WL2, and WL3, the write lines WritL1, WritL2, and WritL3 are arranged parallel to each other and cross the bit lines BL1, BL2, and BL3. The write lines may be arranged mainly to apply magnetic fields that determine the magnetization directions of the resistivity changing memory elements.

The memory cell C11 includes a field effect type transistor T11 and a resistivity changing memory element r11, which may be the same resistivity changing memory 306 shown in FIGS. 3A-3D, FIGS. 4A-4D, whose resistance value varies depending on whether the first ferromagnetic layer structure 308 ("hard layer") and the second ferromagnetic layer structure 312 ("soft layer") are magnetized in parallel directions with respect to each other or in antiparallel directions with respect to each other. In the memory cell C11, the drain of the field effect type transistor T11 is connected to one of the terminals of the resistivity changing memory element r11.

Similarly, each of the memory cells C12 to C33 has a similar structure where one of the field effect type transistors T12 to T33 is connected to corresponding one of the resistivity changing memory elements r12 to r33.

The gate terminals of the field effect type transistors T11, T21, and T31 are all connected to the word line WL1 and the source terminals thereof are all grounded. Similarly, the gate terminals of the field effect type transistors T12, T22, and T32 are all connected to the word line WL2 and the gate terminals of the field effect type transistors T13, T23, and T33 are all connected to the word line WL3, with the source terminals thereof being all grounded.

Also, the other terminals of the resistivity changing memory elements r11, r12, and r13 are all connected to the bit line BL1. Similarly, the other terminals of the resistivity changing memory elements r21, r22, and r23 are all connected to the bit line BL2, and the other terminals of the resistivity changing memory elements r31, r32, and r33 are all connected to the bit line BL3.

Each of the field effect type transistors TWL1, TWL2, TWL3, TWL1', TWL2', and TWL3' are a switching element. If field effect type transistors corresponding to each other (TWL1 and TWL1', for instance) are turned on at the same time, current flows through a corresponding write line (WritL1, for instance).

The field effect type transistors Tb1, Tb2, and Tb3 are each a switching element that applies a voltage $V_{DD}$ corresponding to one of the bit lines BL1, BL2, and BL3 when turned on.

The field effect type transistors T1, T2, and T3 are each a switching element that inputs a voltage level corresponding to one of the bit lines BL1, BL2, and BL3 into one of the input terminals of the Comparators Comp1, Comp2 and Comp3 corresponding to the sense amplifiers SA1, SA2, and SA3 when turned on.

The gate terminals of the field effect type transistors T1, T2, and T3 are all connected to a Voltage Regulator via a line $V_{READ}$, the Voltage Regulator being fed by a Voltage Reference Generator. The Voltage Reference Generator is also connected to the other input terminals of the Comparators Comp 1, Comp2 and Comp3 corresponding to the sense amplifiers SA1, SA2, and SA3 providing a reference Voltage $V_{Ref}$ to these comparators.

Each of the sense amplifiers SA1, SA2, and SA3 are a signal detecting circuit that outputs (first bit and second bit) one of "1" and "0" according to a result of comparison between two inputted voltage levels.

The writing of information into the magnetic memory is carried out by having current flow through both of the desired bit lines and write lines. Also, the reading of information from the magnetic memory is carried out by selectively turning on the field effect type transistors (the transistor T2, for instance) connected to the same sense amplifier and by detecting fluctuations in voltage on the bit line during the reading operation using the sense amplifier.

A write current is applied and flows through both of the write lines (WritL1, WritL2 or WritL3) and a bit line (BL1, BL2 or BL3) and the magnetization direction of the first ferromagnetic layer structure 308 ("hard layer") is determined by a magnetic field generated at the intersections of the write line and bit line. On the other hand, it is sufficient that the second ferromagnetic layer structure 312 ("soft layer") has a small coercive force. Consequently, the second ferromagnetic layer structure 312 ("soft layer") is made of a magnetic film whose magnetization direction is reversed by a relatively weak external magnetic field during a reading operation. The material and the like of the first ferromagnetic layer structure 308 ("hard layer") are selected so that the magnetization direction of the first ferromagnetic layer structure 308 ("hard layer") will not be reversed even if the magnetization direction of the second ferromagnetic layer structure 312 ("soft layer") is reversed during the reading operation.

For instance, in many cases, a resistivity changing memory cell 306 may be constructed using magnetic films made of metallic materials or alloys as the first ferromagnetic layer structure 308 ("hard layer") and the second ferromagnetic layer structure 312 ("soft layer") and using an oxide insulating material, such as Aluminum Oxide ($Al_2O_3$) for the non ferromagnetic layer structure 310.

These circuits are formed on a semiconductor substrate. The semiconductor substrate may be composed mainly of materials which have semiconductor characteristics, such as silicon, germanium, gallium, indium, and diamond, with these materials being used singly or in combination.

The operation of the resistivity changing memory cell according to this embodiment mode is described below.

First, by way of example, the operation for writing information into the resistivity changing memory element r22 is described below.

As shown in FIG. 7, during the write operation, the first bit of information is stored for example in the first ferromagnetic layer structure 308 by applying currents to the write line WritL2 and the bit line BL2 to induce a first magnetic field that determines the magnetization direction of the first ferromagnetic layer structure 308. The second bit of information is stored for example in the second ferromagnetic layer structure 312 by applying currents to the write line WritL2 and the bit line BL2 to induce a second magnetic field to the resistivity changing memory cell 306, this second magnetic field being smaller than the magnetic switching threshold of the first ferromagnetic layer structure 308, hence without altering its magnetization.

Next, the operation for reading information from the resistivity changing memory element r22 is described.

During the read operation, the voltage applied to the word line WL2 is raised to turn on the field effect type transistor T22. As a result, the field effect type transistor Tb2 is turned on and a current flows through the resistivity changing memory element r22 via the bit line BL2. During this operation, the field effect type transistor T2 is turned on, a voltage is inputted into one of the terminals of the comparator Comp2 of the sense amplifier SA2 at the point "A". This voltage is compared with the Reference voltage $V_{Ref}$. This voltage comparison is equivalent to comparing the first resistance value ($1^{st}$ r.v.) of the resistivity changing element 306 (in this example r22) with a Reference resistance value (Ref. r.v.). If the ferromagnetic layer structures 308 and 312 are magnetized in parallel directions with respect to each other the first resistance value ($1^{st}$ r.v.) will be low (i.e. smaller than the Reference resistance value) and a first result (in this example Result_1 of SA2) can be stored in a first Latch (in this example Latch_1 of SA2), for example Result_1=0. If the ferromagnetic layer structures 308 and 312 are magnetized in antiparallel directions with respect to each other the first resistance value ($1^{st}$ r.v.) will be high (i.e. larger than the Reference resistance) and a first result (in this example Result_1 of SA2) can be stored in a first Latch (in this example Latch_1 of SA2), for example Result_1=1.

Next, the second ferromagnetic layer structure 312 ("soft layer") of the resistivity changing memory element 306 (in this example r22) is magnetized in a predetermined direction (initialized) applying an external magnetic field by applying currents to the write line WritL2 and the bit line BL2 to induce a second magnetic field to the resistivity changing memory cell 306, this second magnetic field being smaller than the magnetic switching threshold of the first ferromagnetic layer structure 308, hence without altering its magnetization. Due to the initialization of the ferromagnetic layer structure 312 the magnetization combinations of the ferromagnetic layer structures 308 and 312 may be modified as shown in FIGS. 4A, 4B, 4C and 4D. In two cases the magnetization direction of the ferromagnetic layer structure 312 has been reversed. FIG. 4B shows the resistivity changing element 306 after the reversal of the second ferromagnetic layer structure 412: the ferromagnetic layer structures are now magnetized in parallel directions with respect to each other (low resistance) while originally (FIG. 3B) they were magnetized in antiparallel directions with respect to each other (high resistance). FIG. 4D shows the resistivity changing element 306 after the reversal of the second ferromagnetic layer structure 412: the ferromagnetic layer structures are magnetized in antiparallel directions with respect to each other (high resistance) while originally (FIG. 3D) they were magnetized in parallel directions with respect to each other (low resistance).

Following this, the resistance value of the resistivity changing element 306 (in this example r22) is measured again; and a second resistance value ($2^{nd}$ r.v.) is detected. The voltage applied to the word line WL2 is raised again to turn on the field effect type transistor T22. As a result, the field effect type transistor Tb2 is turned on and a current flows through the resistivity changing memory element r22 via the bit line BL2. During this operation, the field effect type transistor T2 is turned on, a voltage is inputted into one of the terminals of the comparator Comp2 of the sense amplifier SA2 at the point "A". This voltage is compared with the Reference voltage $V_{Ref}$. This voltage comparison is equivalent to comparing the second resistance value of the resistivity changing element 306 (in this example r22) with the Reference resistance value (Ref. r.v.).

If the ferromagnetic layer structures 308 and 312 are magnetized in parallel directions with respect to each other the second resistance value ($2^{nd}$ r.v.) will be low (i.e. smaller than the Reference resistance value) and a second result (in this example Result_2 of SA2) can be stored in a second Latch (in this example Latch_2 of SA2), for example Result_2=0.

The first results (Result_1 in SA2) and the second results (Result_2 in SA2) can be combined in the decoder DEC2 to provide a given set of results according to the logic chosen in the decoder, for example 00 (first bit=0, second bit=0 in SA2) or 10 (first bit=1, second bit=0 in SA2).

If the ferromagnetic layer structures 308 and 312 are magnetized in antiparallel directions with respect to each other the second resistance value ($2^{nd}$ r.v.) will be high (i.e. larger than the Reference resistance value) and a second result (in this example Result_2 of SA2) can be stored in a second Latch (in this example Latch_2 of SA2), for example Result_2=1.

The first results (Result_1 in SA2) and the second results (Result_2 in SA2) can be combined in a decoder to provide a given set of results according to the logic chosen in the decoder, for example 01 (first bit=0, second bit=1 in SA2) or 11 (first bit=1, second bit=1 in SA2).

During this operation, the word lines WL1 and WL3 are grounded to prevent the flow of current to the TMR elements r21 and r23 that are also connected to the bit line BL2.

According to one embodiment, the resistivity changing memory element, can also apply to the thermally assisted spin torque concept.

Figure 8A:
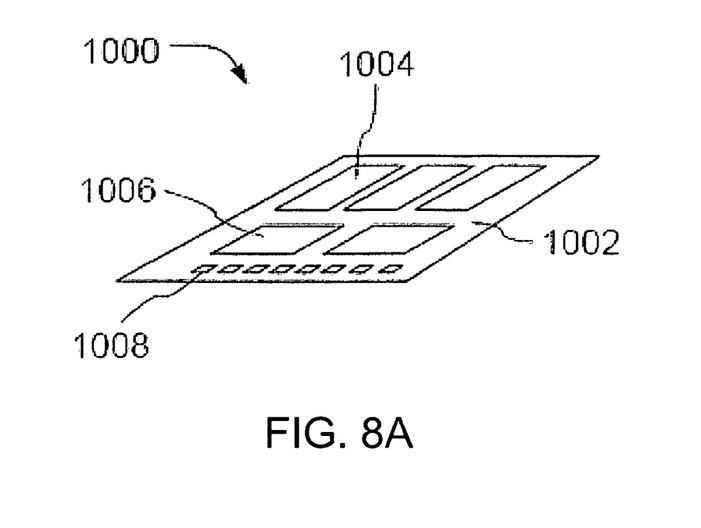
FIG. 8A illustrated one embodiment of a module.
Figure 8B:
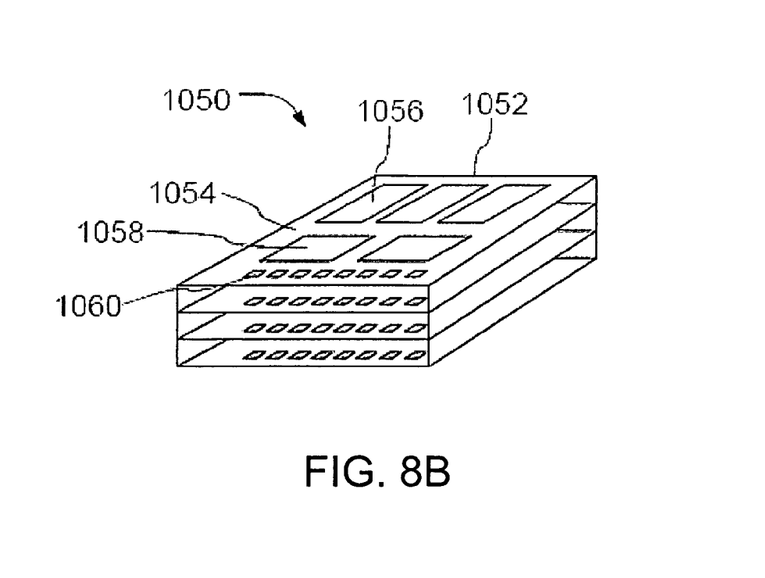
FIG. 8B illustrates one embodiment of a stackable device.

As shown in FIGS. 8A and 8B, in some embodiments, memory devices comprising magnetic tunnel junctions such as those described herein may be used in modules. In FIG. 8A, a memory module 1000 is shown, on which one or more memory devices 1004 are arranged on a substrate 1002. The memory device 1004 may include numerous memory cells, each of which uses a memory element in accordance with an embodiment of the invention (e.g. including the magnetic tunnel junction 700). The memory module 1000 may also include one or more electronic devices 1006, such as memory, processing circuitry, control circuitry, addressing circuitry, bus interconnection circuitry, or other circuitry or electronic devices that may be combined on a module with a memory device, such as the memory device 1004. Additionally, the memory module 1000 includes multiple electrical connections 1008, which may be used to connect the memory module 1000 to other electronic components, including other modules.

As shown in FIG. 8B, in some embodiments, these modules may be stackable, to form a stack 1050. For example, a stackable memory module 1052 may contain one or more memory devices 1056, arranged on a stackable substrate 1054. The memory device 1056 contains memory cells that employ memory elements in accordance with an embodiment of the invention. The stackable memory module 1052 may also include one or more electronic devices 1058, which may include memory, processing circuitry, control circuitry, addressing circuitry, bus interconnection circuitry, or other circuitry or electronic devices that may be combined on a module with a memory device, such as the memory device 1056. Electrical connections 1060 are used to connect the stackable memory module 1052 with other modules in the stack 1050, or with other electronic devices. Other modules in the stack 1050 may include additional stackable memory modules, similar to the stackable memory module 1052 described above, or other types of stackable modules, such as stackable processing modules, control modules, communication modules, or other modules containing electronic components.

Figure 9:
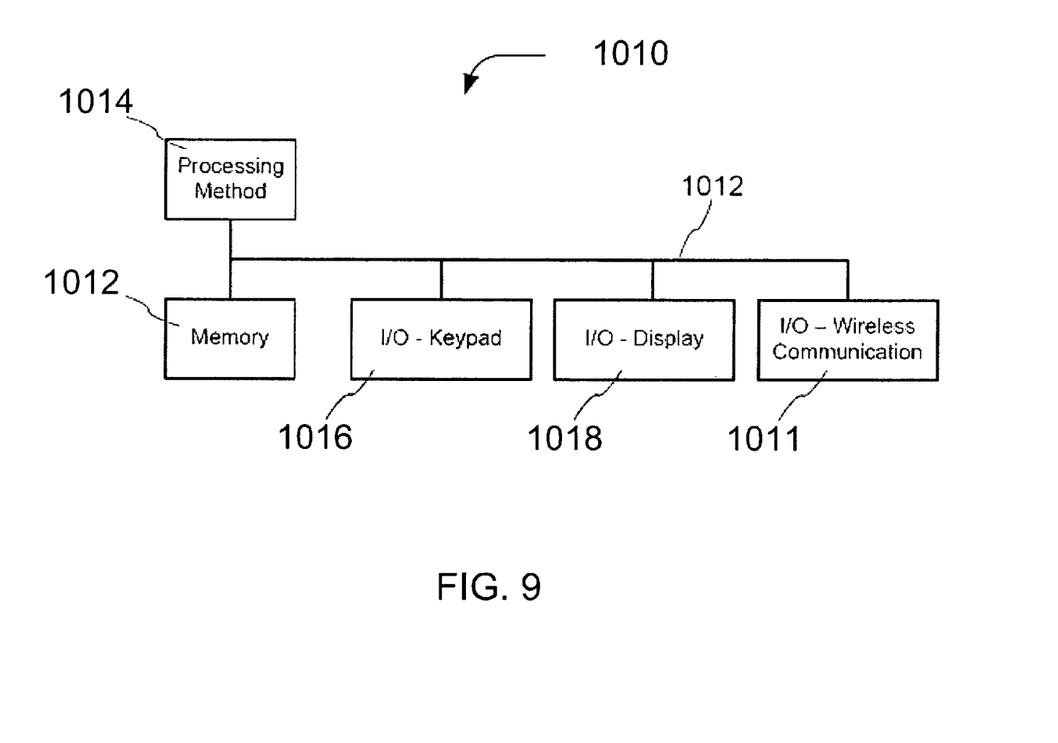
FIG. 9 illustrates one embodiment of a system.

In accordance with some embodiments, memory devices that include memory elements as described herein may be used in a variety of other applications or systems, such as the illustrative computing system shown in FIG. 9. The computing system 1010 includes a memory device 1012, which may include memory elements comprising magnetic tunnel junctions in accordance with an embodiment of the invention (e.g. including the magnetic tunnel junction 700). The system also includes processing method 1014, such as a microprocessor or other processing device or controller, and one or more input/output functionalities or devices, such as a keypad 1016, display 1018, and wireless communication method 1011. The memory device 1012, processing method 1014, keypad 1016, display 1018 and wireless communication device 1011 are interconnected by a bus 1012.

The wireless communication method 1011 may have the ability to send and/or receive transmissions over a cellular telephone network, a WiFi wireless network, or other wireless communication network. It will be understood that the input/output devices, functionalities, and/or methods shown in FIG. 9 are merely examples. Memory devices including memory cells comprising magnetic tunnel junctions in accordance with embodiments of the invention may be used in a variety of systems. Alternative systems may include a variety of input/output devices, functionalities, and/or methods, multiple processors or processing methods, alternative bus configurations, and many other configurations of a computing system. Such systems may be configured for general use, or for special purposes, such as cellular or wireless communication, photography, playing music or other digital media, or any other purpose now known or later conceived to which an electronic device or computing system including memory may be applied.

All embodiments described above can be included, for example, in hard disk drives, computers systems, notebooks, sensor systems (e.g. spin valve sensors in read heads), computer displays and cellular phones.

While the invention has been shown and described with reference to specific embodiments, it should be known to those who employ it that various changes in form and detail may be made therein without departing from the spirit and scope of the invention as defined by the appended claims. The scope of the invention is thus indicated by the appended claims and all changes that are in line with the meaning and range of equivalency of the claims are intended to be embraced.

What is claimed is:

1. A method for determining the state of a resistivity changing memory cell, the method comprising:
    detecting a first resistance of the resistivity changing memory cell;
    determining whether the first resistance value is smaller than a predetermined threshold value thereby determining a first result value; and
    initializing the resistivity changing memory cell into one of at least four resistivity changing memory states;
    detecting a second resistance value of the resistivity changing memory cell;
    determining whether the second resistance value is smaller than the predetermined threshold value determining a second result value; and
    determining the state of the resistivity changing memory cell using the first and the second result values.

2. The method according to claim 1, wherein the resistivity changing memory cell comprises a first ferromagnetic layer structure, a non-ferromagnetic layer structure disposed above the first ferromagnetic layer structure and a second ferromagnetic layer structure disposed above the non-ferromagnetic layer structure.

3. The method according to claim 2, wherein the first ferromagnetic layer structure and the second ferromagnetic layer structure comprise materials such as PtMn, CoFe, Ru, and NiFe.

4. The method according to claim 2, wherein the non-ferromagnetic layer structure comprises $Al_2O_3$.

5. The method according to claim 2, the second ferromagnetic layer structure having a magnetic switching threshold that is smaller than the magnetic switching threshold of the first ferromagnetic layer structure.

6. The method according to claim 5, comprising initializing the resistivity changing memory cell by applying a magnetic field, the magnetic field being smaller than the magnetic switching threshold of the first ferromagnetic layer structure.

7. The method according to claim 1, comprising storing the first result value in a first storing device.

8. The method according to claim 7, wherein the first storing device is a latch.

9. The method according to claim 1, comprising storing the second result value in a second storing device.

10. The method according to claim 9, wherein the second storing device is a latch.

11. An integrated read circuit for determining the state of a resistivity changing memory cell, the circuit comprising:
    a circuit configured to detect a first resistance of the resistivity changing memory cell;

a circuit configured to determine whether the first resistance value is smaller than a predetermined threshold value thereby determining a first result value;

a circuit configured to initialize the resistivity changing memory cell into one of at least four resistivity changing memory states;

a circuit configured to detect a second resistance value of the resistivity changing memory cell;

a circuit configured to determine whether the second resistance value is smaller than the predetermined threshold value determining a second result value; and a circuit configured to determine the state of the resistivity changing memory cell using the first and the second result values.

12. The integrated circuit according to claim 11, wherein the resistivity changing memory cell comprises a first ferromagnetic layer structure, a non-ferromagnetic layer structure disposed above the first ferromagnetic layer structure and a second ferromagnetic layer structure disposed above the non-ferromagnetic layer structure.

13. The integrated circuit according to claim 12, wherein the resistivity changing memory cell comprises a magnetic tunnel junction.

14. A computing system comprising:
an input apparatus;
an output apparatus;
a processing apparatus;
the integrated circuit of claim 11.

15. The computing system of claim 14, wherein at least one of the input apparatus and the output apparatus comprises a wireless communication apparatus.

* * * * *